United States Patent [19]
Feldtkeller

[11] Patent Number: 6,137,668
[45] Date of Patent: *Oct. 24, 2000

[54] POWER SWITCH WITH OVERLOAD PROTECTION

[75] Inventor: Martin Feldtkeller, München, Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 09/162,854

[22] Filed: Sep. 29, 1998

[30]     Foreign Application Priority Data

Sep. 29, 1997 [DE] Germany .............. 197 42 930

[51] Int. Cl.⁷ .................................................. H02H 5/04
[52] U.S. Cl. ................ 361/103; 361/94; 361/98
[58] Field of Search ............. 361/83, 89, 91.1, 361/91.3, 91.5, 93.8, 94–98, 101, 103, 93.2; 307/140, 141, 141.4; 257/173

[56]         References Cited

U.S. PATENT DOCUMENTS 4,355,344 10/1982 Felici et al. ....................... 361/103
4,787,007 11/1988 Matsumura et al. .................. 361/98
5,383,083  1/1995 Shinoda et al. .................... 361/103
5,467,242 11/1995 Kiraly ................................. 361/94
5,506,539  4/1996 Kelly et al. ......................... 327/379
5,555,152  9/1996 Brauchle et al. ................... 361/103
5,723,915  3/1998 Maher et al. ....................... 307/131
5,737,169  4/1998 Sellers .................................. 361/98

FOREIGN PATENT DOCUMENTS 39 36 544 A1  6/1990  Germany .

*Primary Examiner*—Josie Ballato
*Assistant Examiner*—Kim Huynh
*Attorney, Agent, or Firm*—Herbert L. Lerner; Laurence A. Greenberg; Werner H. Stemer

[57]            ABSTRACT

An overload protection circuit for a power switch has a delay element by means of which the voltage which is dropped across the power switch, the supply voltage and a temperature margin are evaluated in comparison with a maximum permissible depletion layer temperature. In the practical embodiment, a capacitor is provided which is charged and discharged by suitably controlled current sources. A disconnect signal for switching the power switch is produced by comparing the capacitor voltage with the temperature margin. The circuit ensures a safe disconnection in the event of a short condition in the load, even in the case of a periodic switching operation of the power switch.

12 Claims, 2 Drawing Sheets

6,137,668

POWER SWITCH WITH OVERLOAD PROTECTION

BACKGROUND OF THE INVENTION

Field of the Invention

The invention relates to a power switch (breaker) that is connected in a current path between connections of a supply voltage, and has switching devices for overload protection.

Power switches are connected in series with a load between the terminals of the supply voltage in order to switch the supply voltage to the load. It is necessary to protect the power switches against overloading in order to prevent destruction resulting from excessive heat losses. It is particularly critical if a short occurs in the load and virtually the entire supply voltage is present across the power switch.

Measures for short-circuit protection of a power switch that is operated cyclically is disclosed in Published, Non-Prosecuted German Patent Application DE 39 36 544 A1. An input signal that controls the switching transistor is delayed by a constant delay time. The delayed control signal disconnects the power transistor that is switched on the occurrence of an overvoltage condition caused by a load short.

In addition, the power transistor is disconnected when an overtemperature condition is detected by a temperature sensor that is thermally coupled to the power transistor.

SUMMARY OF THE INVENTION

It is accordingly an object of the invention to provide a power switch with overload protection which overcomes the above-mentioned disadvantages of the prior art devices of this general type, which allows safe disconnection in all operating conditions.

With the foregoing and other objects in view there is provided, in accordance with the invention, a power switching circuit with overload protection circuitry, including: a power transistor connected in a current path between connections of a supply voltage; a control signal received by the power transistor for switching the power transistor between a conducting state and a non-conducting state; and a delay element having a temperature element thermally coupled to the power transistor and receiving the control signal, the delay element outputting a disconnect signal produced after a time delay for switching the power transistor to the non-conducting state, the delay element having a means for forming the time delay in dependence on a voltage dropped across the power transistor, the supply voltage and a temperature signal indicating a difference between a reference value and a temperature of the temperature element.

The invention can be applied particularly advantageously in the situation where the power transistor and the circuit configuration for overload protection are disposed on separate, but thermally coupled integrated circuits. The timer allows safe disconnection in the event of a short condition on the load, where the full operating voltage is present across the power transistor. The overload protection is, furthermore, particularly suitable for use with periodically switched power transistors which are used, for example, in bridge circuits for motor drives. Both the heat losses produced by the switching pulse and the heat losses accumulated from the preceding switching processes are taken into account in this case. The overload protection is also suitable when there is poor thermal coupling between the power transistor and the temperature sensor and, furthermore, for a wide supply voltage fluctuation range, since the supply voltage is included in the calculation of the time delay for disconnection. Separating the power chip and control chip ensures a high degree of immunity to disturbances caused by overcurrent spikes. Since different production processes, matched to their respective function, are used for the production of the two circuits, this results in optimized production costs.

In accordance with an added feature of the invention, the time delay is inversely proportional to the voltage dropped across the power transistor.

In accordance with an additional feature of the invention, the time delay is proportional to a square of the temperature signal.

In accordance with another feature of the invention, the time delay is inversely proportional to the supply voltage.

In accordance with a further added feature of the invention, the control signal is a periodic clock signal, and the time delay is less than a value that is proportional to a square of the temperature signal, inversely proportional to the voltage dropped across the power transistor, and inversely proportional to the supply voltage.

In accordance with a further additional feature of the invention, the time delay is set so that a ratio of a conducting state time duration of the power transistor divided by a switching period does not exceed a value which is proportional to the temperature signal divided by the voltage dropped across the power transistor.

In accordance with yet another feature of the invention, the delay element includes: a first controllable current source having a first end and a second end, the first controllable current source controlled in proportion to the voltage dropped across the power transistor, in proportion to the supply voltage and inversely proportional to the temperature signal; a capacitor connected to the first end of the first controllable current source; the supply voltage having a first supply potential connection and a second supply potential connection, the second end of the first controllable current source connected to the first supply potential connection; a second current source connected to the second supply potential connection and to the capacitor; and a comparator having inputs terminals connected to the capacitor and receiving a predetermined comparison value, the comparator comparing a voltage across the capacitor to the predetermined comparison value and outputting the disconnect signal for switching the power transistor to the non-conducting state.

In accordance with yet another added feature of the invention, the second current source is a controllable current source controlled as a function of the supply voltage.

In accordance with yet another additional feature of the invention, the predetermined comparison value of the comparator is formed from the temperature signal.

In accordance with an added feature of the invention, the delay element has a multiplying and dividing device receiving the supply voltage, a drain voltage of the power transistor and the temperature signal for deriving a further control signal received by and controlling the first controllable current source, the multiplying and dividing device multiplying the supply voltage by the drain voltage deriving a first result and then dividing the first result by the temperature signal for deriving the further control signal.

In accordance with a concomitant feature of the invention, the delay element has a switch connected in a current path of the first controllable current source, the switch receiving and controlled by the control signal switching the power transistor.

Other features which are considered as characteristic for the invention are set forth in the appended claims.

Although the invention is illustrated and described herein as embodied in a power switch with overload protection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
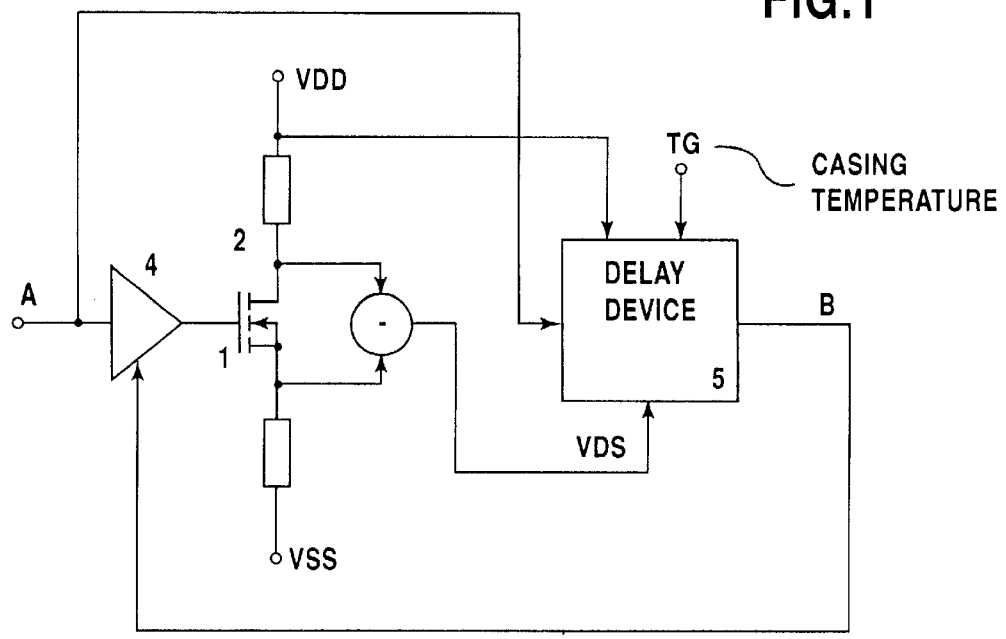
FIG. 1 is a circuit diagram outlining a power transistor circuit with overload protection circuitry according to the invention.

Referring now to the figures of the drawing in detail and first, particularly, to FIG. 1 thereof, there is shown a power switch (breaker) having an MOS field-effect transistor 1 as the power switch. The transistor 1 is connected in a current path that is connected between connections of a supply voltage VDD and VSS. There is a load 2 in series with the MOSFET 1. A control signal A is passed via a driver 4 to a gate connection of the MOSFET 1 in order to connect or disconnect the MOSFET 1, as a result of which the load 2 is connected to or disconnected from the supply voltage. The MOSFET 1 is an n-channel MOS transistor whose source connection is coupled to the negative supply potential VSS, with the load being on the drain side (low-side switch). The invention can also be applied to a high-side switch, whose drain connection is connected to the positive supply voltage VDD and whose load is connected on the source side to the negative supply potential.

A device 5 is provided which is used, after the detection of an overload condition, to produce a disconnect signal B which blocks the driver 4 and thus immediately switches off the transistor 1. The switching signal A is also supplied to the device 5. The device 5 interrogates other signals to determine a delay, so that the switching-on flank of the signal A is, in consequence, output with a delay as the signal B for disconnection. The time delay $t_p$ is calculated from the supply voltage VDD, the voltage VDS dropped across the drain-source path through the switching transistor 1, and a signal TG that indicates a temperature. The temperature is, for example, the temperature of the integrated circuit in which the delay device 5 is disposed. The power transistor 1 and the delay device 5 need not necessarily be disposed on the same integrated circuit. In fact, it is sufficient for the circuit of the delay device 5 and the transistor 1 to be disposed on separate chips, but with adequate thermal coupling to one another. In this case, the temperature of the delay device 5 is approximately equal to the casing temperature of the transistor 1.

The time delay $t_p$ produced by the delay device 5 satisfies the relationship $$t_p \approx \frac{(Tj\max - TG)^2}{VDS \cdot VDD}$$

where:
Tjmax: maximum permissible depletion layer temperature of the power breaker;
TG: temperature of the delay device 5;
VDS: drain-source voltage of the power transistor 1;
VDD: supply voltage with respect to ground VSS.

The maximum possible time delay $t_p$ is thus set to be proportional to the square of the temperature margin. That is to say the time delay $t_p$ is the difference between the maximum depletion layer temperature and the present casing temperature, and to be inversely proportional to the drain-source voltage of the power transistor and to the supply voltage. Ideally, the maximum delay time applies only to a single switching-on process for the power transistor.

Furthermore, if the power transistor 1 is switched periodically, it is necessary to take account of the heat losses accumulated from preceding connected times. The time delay during which the power transistor 1 can remain connected in each period without being destroyed is shorter than the maximum value defined by the above formula. The time delay for the overload-dependent disconnection for the periodic switching operation of the transistor 1 must be determined in such a manner that the duty ratio, that is to say the ratio between the connected time duration of the power transistor divided by the switching period, satisfies the following relationship:

$$D \approx \frac{Tj\max - TG}{VDS}$$

For periodic switching operations, the duty ratio is set such that, when the power transistor is connected again after a fraction of the maximum delay time for an individual pulse multiplied by the reciprocal of the maximum duty ratio, the subsequent time delay may likewise be only the fraction of the maximum delay time for the individual pulse. While the switching period is set by the signal A which controls the power breaker, the duty ratio and thus the connection time (or the time delay) are given by the latter of the formulae quoted above.

Figure 2:
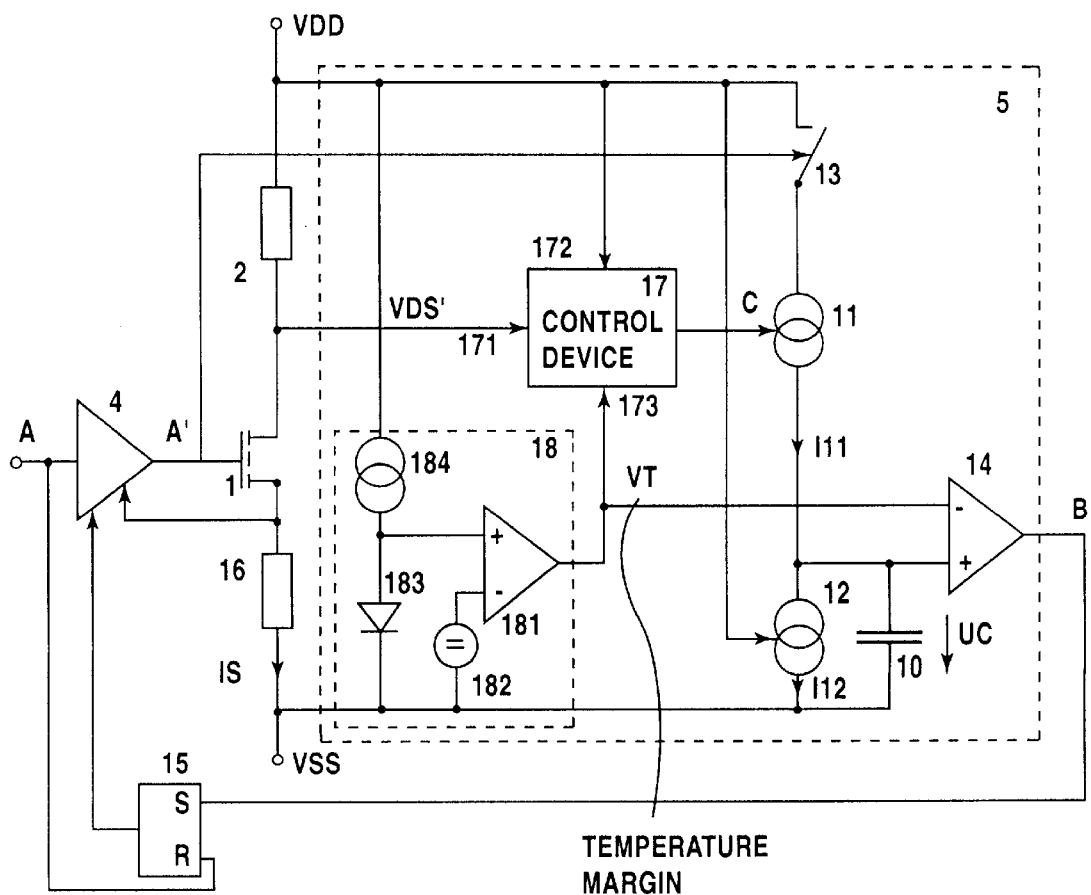
FIG. 2 is a circuit diagram of circuitry for implementation of the overload protection circuitry for the power transistor.

FIG. 2 illustrates a configuration of the delay device or circuit 5 that is expedient for integration. The delay circuit 5 contains a capacitor 10, one connection of which is connected via a first current source 11 to the positive supply potential VDD. The same connection of the capacitor 10 is also connected to ground VSS via a second current source 12. The other connection of the capacitor 10 is connected directly to ground. The capacitor 10 is charged via the current source 11 while the power transistor 1 is switched on. A switch 13 is for this purpose connected in the current path of the current source 11 and is controlled in parallel with the power transistor 1 by a control signal A' at the output of the driver 4. The capacitor 10 is continually discharged via the current source 12. The charge on the capacitor 10 represents a measure of the present temperature in the power transistor 1. The capacitor voltage is supplied to the positive input of a comparator 14. A comparison threshold is applied to the negative input of the comparator 14 so that the disconnect signal B is produced when the capacitor voltage exceeds the comparison threshold (value). The disconnect signal B is supplied to the set input S of a memory element (flip-flop) 15, in order to retain the disconnection information. The output of the flip-flop 15 disconnects the driver 4. The power transistor 1 is switched on again by a new switching-on pulse of the control signal A, by supplying the switching-on pulse A to the reset input of the flip-flop 15 so that the driver 4 is released again. Furthermore, a low-value current-limiting resistor 16 is connected on the source side to the power transistor 1. The voltage dropped across the resistor 16 is signaled to the driver 4. If an unacceptably high current rise occurs, an increased voltage is dropped across the resistor 16 such that the driver 4 is likewise blocked, or the driver 4 reduces the gate voltage of the power transistor 1 at least to such an extent that the current flowing via the power transistor 1 does not rise above a predetermined maximum current.

The current flowing through the first controlled current source 11 is controlled by a control signal C that is provided by a control device 17. The control device 17 is a multiplier/divider with two multiplier inputs 171, 172 and one dividing input 173. The drain voltage of the power transistor 1 is supplied to the input 171. Since a relatively low voltage is dropped across a low-value current-limiting resistor 16, the drain voltage of the power transistor 1 is virtually equal to its drain-source voltage. In normal operation with a non-defective load 2, the voltage dropped across the load 2 is sufficiently high that the drain voltage VDS' of the power transistor 1 is virtually 0 V. The heat losses developed in the transistor 1 are low and are not critical. In the event of a short in the load 2, virtually the entire supply voltage VDD is present across the transistor 1. The power losses developed in the transistor 1 are correspondingly high and can lead to destruction of the transistor 1. The drain voltage VDS', as a characteristic voltage of the power transistor 1, is thus supplied to the multiplier/divider 17 as a characteristic signal for the drain-source voltage of the transistor 1. In addition, the supply voltage VDD with respect to ground is supplied to the connection 172 of the multiplier/divider 17. Particularly for applications in motor vehicle electronics, it is necessary for the overload disconnection to operate reliably over a wide supply voltage range from 6 to 40 volts. The supply voltage VDD is thus applied to the connection 172 of the device 17.

The control signal C is varied in proportion to the input signals VDS' and VDD. The connection 173 is supplied with a signal VT that indicates the temperature margin, that is to say the difference between the maximum depletion layer voltage Tjmax and the casing temperature TG. The lower the temperature margin is, the greater is the level at which the current source 11 must be driven. The signal C is thus controlled to be inversely proportional to the temperature margin VT. The signal VT is produced in a circuit 18 by using the temperature dependency of the depletion layer voltage of a pn junction. In detail, a differential amplifier 181 is provided, to whose negative input a reference voltage is applied which is produced in a temperature-stable manner, for example, by a band-gap voltage source 182. The voltage that can be tapped off on a diode 183 with respect to ground is supplied to the positive input. The anode connection of the diode 183 is connected via a current source 184 to the positive supply voltage VDD. The diode must be disposed relative to the power transistor 1 so as to achieve a thermal coupling. The depletion layer temperature of the diode is in this case virtually equal to the casing temperature of the power transistor 1. As already stated above, the capacitor 10 is charged by the current source 11, its current I11 being controlled as a function of the drain voltage of the power transistor 1, the supply voltage VDD and the temperature margin VT. For discharging the capacitor 10 via the current source 12, the current I12 forced to flow by the current source 12 is controlled as a function of the supply voltage VDD by connecting the control input of the current source 12 to the connection for the supply potential VDD. The information about the supply voltage is always available for controlling the discharge process. The comparison threshold that is applied at the negative input of the comparator 14 is the signal VT for the temperature margin.

In detail, the overall circuit for determining the time delay $t_d$ for cyclic switching operation of the power transistor 1 operates as now described. The charging process, by which the time delay $t_d$ before the comparator is activated, is governed by:

$$t_d \approx UT \cdot \frac{1}{I11} = (Tj\max - TG) \cdot \frac{1}{VDS' \cdot VDD}$$
$$Tj\max - TG$$

This takes account of the fact that the current I11 through the device 17 is set as a function of the temperature margin, the drain voltage and the supply voltage. By comparison with the first formula mentioned above, it can be seen that the charging process corresponds to the maximum delay time $t_d$ for a single connection process. Periodic switching of the power transistor 1 is now taken into account by the current source 12, in that the ratio of the discharge current to the charging current corresponds to the duty ratio of the connected state and the switching period of the power breaker 1:

$$D \approx I12 \cdot \frac{1}{I11} \approx \frac{Tj\max - TG}{VDS' \cdot VDD} \cdot VDD$$

The behavior of the circuit thus corresponds to the relationship quoted above for the duty ratio D. The voltage across the capacitor 10 is governed by the ratio of the currents forced to flow from the controlled current sources 11, 12 and is compared in the comparator 14 with the temperature margin VT in order to determine the disconnection delay time of the power transistor 1 after a connection pulse. As a consequence of this, a duty ratio is set as indicated by the above formula. This ensures that overloading of the power transistor 1 in the event of a load short is safely prevented during periodic switching operations. In this case, account is taken of the heat losses that have accumulated from previous switching processes. The delay circuit operates satisfactorily over a wide supply voltage range, even if the thermal coupling between the temperature sensor and the power transistor is loose.

Figure 3:
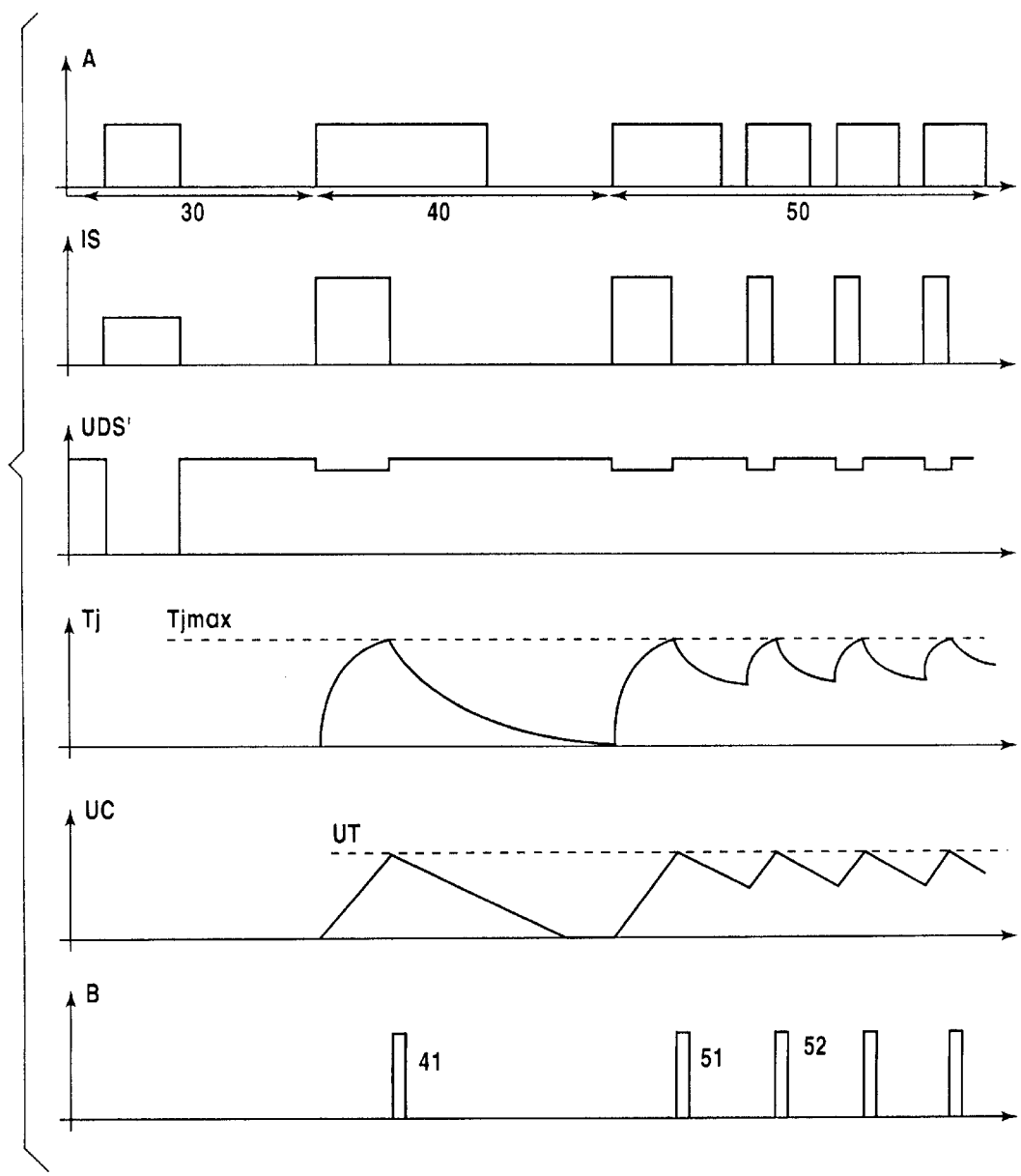
FIG. 3 is a plurality of signal diagrams of signals that occur in the overload protection circuitry shown in FIG. 2.

FIG. 3 shows the switching signal A, the transistor current IS, the drain voltage VDS', the depletion layer temperature Tj of the power transistor 1, the capacitor voltage UC and the disconnection pulse B. The time interval 30 indicates normal operation with a non-defective load 2. The voltage drop across the load 2 ensures that virtually no voltage is dropped across the power transistor 1 during the connected phase. The temperature of the power transistor 1 is not increased. The time interval 40 represents a single connection process in the event of a short on the load 2. Virtually the entire supply voltage is dropped across the transistor 1 while it is in the switched-on state. The temperature Tj of the depletion layers in the power transistor 1 rises. The capacitor voltage UC rises in a corresponding manner. A disconnection pulse

41 is produced on reaching the temperature margin VT. Periodic operation is illustrated in the time interval 50. When the first connection pulse occurs, the depletion layer temperature Tj rises until the capacitor voltage UC reaches the comparison value VT of the temperature margin. This is followed by a disconnection pulse 51. The depletion layer temperature Tj drops, and the capacitor voltage UC falls in a corresponding manner by the capacitor 10 being discharged through the current source 12. The transistor 1 is switched on again by a further connection pulse in the control signal A. The depletion layer temperature Tj rises once again, and the capacitor 10, which has not yet been completely discharged, is charged again via the current source 11 until the comparator 14 is activated again and produces a disconnection pulse 52. This process is continued periodically.

I claim:

1. A power switch circuit with overload protection circuitry, comprising:

a power transistor connected in a current path between connections of a supply voltage;

a control signal received by said power transistor for switching said power transistor between a conducting state and a non-conducting state; and a delay element having a temperature element thermally coupled to said power transistor and receiving said control signal, said delay element outputting a disconnect signal produced after a variable time delay for switching said power transistor to the non-conducting state, said delay element further having a means for calculating said variable time delay using direct measurements of (a) a voltage dropped across said power transistor, (b) the supply voltage and (c) a temperature signal indicating a difference between a reference value and a temperature of said temperature element.

2. The power switch circuit according to claim 1, wherein said time delay is inversely proportional to said voltage dropped across the power transistor.

3. The power switch circuit according to claim 2, wherein said time delay is proportional to a square of said temperature signal.

4. The power switch circuit according to claim 3, wherein said time delay is inversely proportional to said supply voltage.

5. The power switch circuit according to claim 1, wherein said control signal is a periodic clock signal, and said time delay is less than a value that is proportional to a square of said temperature signal, inversely proportional to said voltage dropped across said power transistor, and inversely proportional to the supply voltage.

6. The power switch circuit according to claim 1, wherein said time delay is set so that a ratio of a time duration of the conducting state of said power transistor divided by a switching period does not exceed a value which is proportional to said temperature signal divided by said voltage dropped across said power transistor.

7. The power switch circuit according to claim 1, wherein said delay element includes:

a first controllable current source having a first end and a second end, said first controllable current source controlled in proportion to said voltage dropped across said power transistor, in proportion to the supply voltage and inversely proportional to said temperature signal;

a capacitor connected to said first end of said first controllable current source;

the supply voltage having a first supply potential connection and a second supply potential connection, said second end of said first controllable current source connected to the first supply potential connection;

a second current source connected to the second supply potential connection and to said capacitor; and a comparator having inputs terminals connected to said capacitor and receiving a predetermined comparison value, said comparator comparing a voltage across said capacitor to said predetermined comparison value and outputting said disconnect signal for switching said power transistor to the non-conducting state.

8. The power switch circuit according to claim 7, wherein said second current source is a controllable current source controlled as a function of the supply voltage.

9. The power switch circuit according to claim 7, wherein said predetermined comparison value of said comparator is formed from said temperature signal.

10. The power switch circuit according to claim 7, wherein said delay element has a multiplying and dividing device receiving the supply voltage, a drain voltage of the power transistor and said temperature signal for deriving a further control signal received by and controlling said first controllable current source, said multiplying and dividing device multiplying the supply voltage by said drain voltage deriving a first result and then dividing said first result by said temperature signal for deriving said further control signal.

11. The power switch circuit according to claim 7, wherein said delay element has a switch connected in a current path of said first controllable current source, said switch receiving and controlled by said control signal switching said power transistor.

12. A power switch circuit with overload protection circuitry, comprising:

a power transistor connected in a current path between connections of a supply voltage;

a control signal received by said power transistor for switching said power transistor between a conducting state and a non-conducting state; and a delay element having a temperature element thermally coupled to said power transistor and receiving said control signal, said delay element outputting a disconnect signal produced after a variable time delay for switching said power transistor to the non-conducting state, said delay element further having a time delay device for calculating said variable time delay using direct measurements of (a) a voltage dropped across said power transistor, (b) the supply voltage and a temperature signal indicating a difference between a reference value and (c) a temperature of said temperature element.

* * * * *